United States Patent
Barnette et al.

(10) Patent No.: US 10,951,216 B1
(45) Date of Patent: Mar. 16, 2021

(54) SYNCHRONIZATION OF CLOCK SIGNALS GENERATED USING OUTPUT DIVIDERS

(71) Applicant: Silicon Laboratories Inc., Austin, TX (US)

(72) Inventors: James D. Barnette, Austin, TX (US); William Anker, Londonderry, NH (US); Xue-Mei Gong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/600,793

(22) Filed: Oct. 14, 2019

(51) Int. Cl.
*H03L 7/087* (2006.01)
*H03L 7/099* (2006.01)

(52) U.S. Cl.
CPC ............ *H03L 7/0992* (2013.01); *H03L 7/087* (2013.01)

(58) Field of Classification Search
CPC ....... H03L 7/0992; H03L 7/087; H03K 3/011; H03K 3/015
See application file for complete search history.

(56) References Cited

U.S. PATENT DOCUMENTS

| | | | |
|---|---|---|---|
| 8,692,599 B2 | 4/2014 | Gong et al. | |
| 8,791,734 B1 | 7/2014 | Hara et al. | |
| 10,320,509 B2 | 6/2019 | Huang et al. | |
| 2015/0109038 A1* | 4/2015 | Waltari | H03L 7/18 327/158 |
| 2019/0007055 A1 | 1/2019 | Nelson | |

\* cited by examiner

*Primary Examiner* — Sibin Chen
(74) *Attorney, Agent, or Firm* — Zagorin Cave LLP

(57) ABSTRACT

A method includes generating a filtered phase difference signal based on a reference clock signal and a feedback clock signal. The method includes generating a first output clock signal based on a first divider control signal and an input clock signal. The feedback clock signal is based on the first output clock signal. The method includes generating a first time code based on a counter signal and a first update of the first output clock signal in response to an update of the filtered phase difference signal to a first value from a second value. The second output clock signal is based on a second divider control signal, the input clock signal, and an error correction signal generated based on the first value, the second value, the first time code, and the second time code. The first and second divider control signals are based on the filtered phase difference signal.

20 Claims, 8 Drawing Sheets

SYNCHRONIZATION OF CLOCK SIGNALS GENERATED USING OUTPUT DIVIDERS

BACKGROUND

Field of the Invention

This invention relates to generating clock signals for electronic devices and more particularly to generating clock signals using phase-locked loops with output dividers.

Description of the Related Art

A typical clock generator utilizes a phase-locked loop supplied with a reference signal from a source such as a crystal oscillator to generate output clock signals having frequencies consistent with a target application. A divider value of a feedback divider in the phase-locked loop can determine the frequency of an output clock signal supplied by the clock generator. Thus, a reference frequency supplied by a reference clock signal to the phase-locked loop is multiplied based on the divider value to generate the synthesized clock signal. Clock generators that synthesize multiple output clock signals use a distinct phase-locked loop for each independently synthesized clock signal. The distinct phase-locked loops have slightly different bandwidth and loop characteristics that result in a changing phase relationship between any two independently synthesized clock signals. However, specifications for some applications require that the frequencies and phases of multiple output clock signals be synchronous for any combination of fractional divider values. Accordingly, improved techniques for synthesizing clock signals are desired.

SUMMARY OF EMBODIMENTS OF THE INVENTION

In at least one embodiment, a clock generator includes a loop filter configured to generate a filtered phase difference signal based on a reference clock signal and a feedback clock signal. The clock generator includes a first output divider configured to generate a first output clock signal responsive to an input clock signal and a first divider control signal based on the filtered phase difference signal. The first output divider is configured to generate a first time code based on a counter signal and a first update of the first output clock signal in response to an update of the filtered phase difference signal to a first value from a second value. The feedback clock signal is based on the first output clock signal. The clock generator includes a second output divider configured to generate a second output clock signal responsive to the input clock signal, a second divider control signal, and a correction signal. The second divider control signal is based on the filtered phase difference signal. The second output divider is configured to generate a second time code based on the counter signal and a second update of the second output clock signal in response to the update of the filtered phase difference signal. The clock generator includes an error correction circuit configured to generate the correction signal based on the first time code, the second time code, the first value, and the second value.

In at least one embodiment, a method for operating a clock generator includes generating a filtered phase difference signal based on a reference clock signal and a feedback clock signal. The method includes generating a first output clock signal based on a first divider control signal and an input clock signal. The first divider control signal is based on the filtered phase difference signal. The feedback clock signal is based on the first output clock signal. The method includes generating a first time code based on a counter signal and a first update of the first output clock signal in response to an update of the filtered phase difference signal to a first value from a second value. The method includes generating a second output clock signal based on a second divider control signal, the input clock signal, and an error correction signal. The second divider control signal is based on the filtered phase difference signal. The method includes generating a second time code based on the counter signal and a second update of the second output clock signal in response to the update of the filtered phase difference signal. The method includes generating the error correction signal based on the first value, the second value, the first time code, and the second time code.

In at least one embodiment, a method for operating a clock product includes, in response to a first divider value being an integral multiple of a second divider value, configuring a first output divider cascaded with a first phase-locked loop and a second output divider cascaded with the first output divider. The method includes, in response to the first divider value being a nonintegral multiple of the second divider value, configuring the first output divider cascaded with the first phase-locked loop and to provide a feedback signal of the first phase-locked loop and configuring a second output divider cascaded with the first phase-locked loop in parallel with the first output divider and responsive to an error correction signal based on a difference in response times of the first output divider and the second output divider to a change in a filter phase difference signal of the first phase-locked loop.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
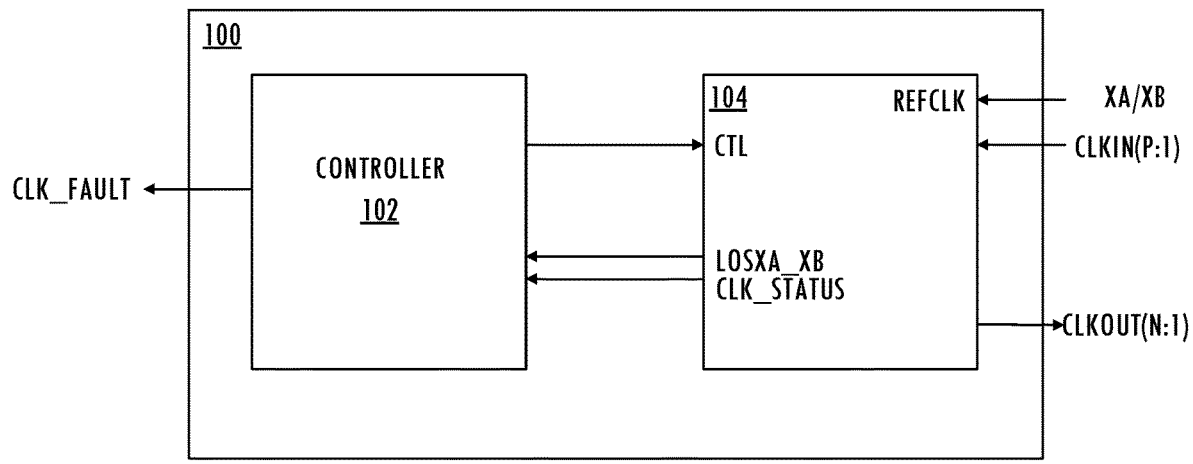
FIG. 1 illustrates a functional block diagram of an exemplary clock product.

Referring to FIG. 1, an embodiment of clock product 100 includes controller 102 and clock generator 104, which monitors at least one received clock signal (e.g., CLKIN(P: 1)) using clock signal REFCLK (e.g., a clock signal generated using a crystal oscillator including an external crystal coupled to XA/XB input terminal) and provides at least one output clock signal CLKOUT(N:1) and at least one clock quality signal, where P and N are integers greater than zero. Controller 102 provides configuration information to clock generator 104 using interface signals CTL. Clock generator 104 provides clock quality information (e.g., LOSXA_XB or CLK_STATUS) to controller 102, which outputs one or more alarm signals (e.g., CLK_FAULT) based on the clock quality information.

Figure 2:
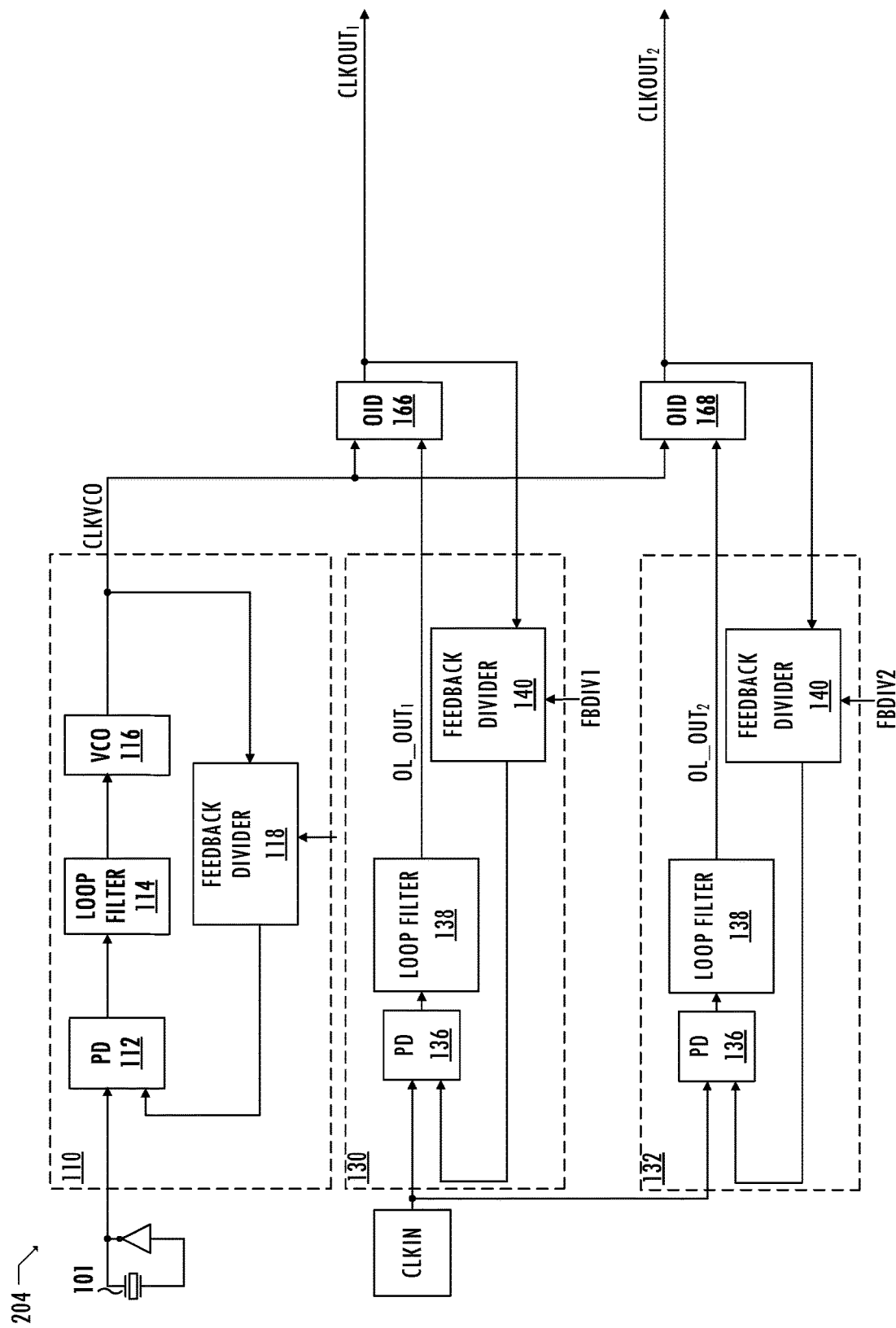
FIG. 2 illustrates a functional block diagram of a clock generator including output dividers coupled in parallel.

Referring to FIG. 2, clock generator 204 includes phase-locked loop 110, which is used to generate clock signal CLKVCO. In an embodiment, phase-locked loop 110 receives a stable clock signal form a stable source such as crystal oscillator 101, a microelectromechanical structure (MEMS) oscillator, or other suitable low-jitter source. Phase-locked loop 110, includes phase/frequency detector 112, which generates a phase difference signal based on the stable clock signal and a feedback signal provided by feedback divider 118. Phase/frequency detector 112 provides the phase difference signal to voltage-controlled oscillator 116 via loop filter 114. Voltage-controlled oscillator 116 may be implemented as a ring oscillator, an LC oscillator, or other suitable oscillator structure.

In an embodiment of clock generator 204, phase-locked loop 110 provides clock signal CLKVCO to an output divider. Although the output divider of FIG. 2 is an output interpolative divider, in other embodiments, the output divider is an integer frequency divider or other frequency-dividing mechanism. Output interpolative divider 166 is configured as a digitally-controlled oscillator responsive to filtered phase difference signal OL_OUT$_1$, and to output interpolative divider 168, which is configured as a digitally-controlled oscillator responsive to filtered phase difference signal OL_OUT$_2$. Outer phase-locked loop 130 and outer phase locked loop 132 generate filtered phase difference signal OL_OUT$_1$ and filtered phase difference signal OL_OUT$_2$, respectively, which are used as independent fractional frequency divider ratios for output interpolative divider 166 and output interpolative divider 168, respectively. Different bandwidths and loop characteristics cause output clock signal CLKOUT$_1$ and output clock signal CLKOUT$_2$ to have a changing relationship over time.

Figure 3:
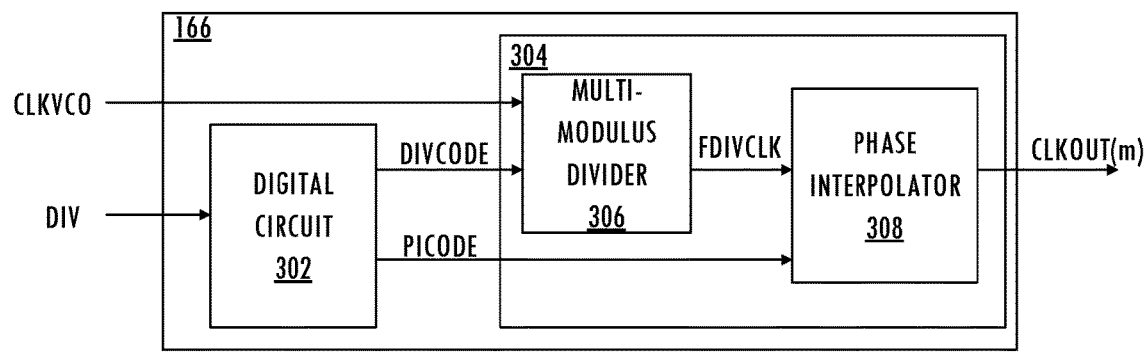
FIG. 3 illustrates a functional block diagram of an exemplary output interpolative divider.

FIG. 3 illustrates an exemplary output interpolative divider. Digital circuit 302 generates digital control signals for analog portion 304 of the output interpolative divider including multi-modulus divider 306 and phase interpolator 308 based on input divider control code DIV. Digital circuit 302 generates sequences of corresponding digital control codes DIVCODE and PICODE that drive multi-modulus divider 306 and phase interpolator 308, respectively. Multi-modulus divider 306 counts down an integer number of corresponding edges of clock signal CLKVCO as indicated by digital control code DIVCODE before generating a corresponding output edge of frequency-divided clock signal FDIVCLK. Phase interpolator 308 interpolates between frequency-divided clock signal FDIVCLK and one or more delayed versions of frequency-divided signal FDIVCLK (e.g., one or more equally spaced phases of frequency-divided clock signal FDIVCLK) based on digital control code PICODE, which corresponds to the phase error, using techniques that are well known in the art. In at least one embodiment, phase interpolator 308 delays frequency-divided clock signal FDIVCLK by selecting from 256 equally spaced phases of frequency-divided clock signal FDIVCLK.

Figure 4:
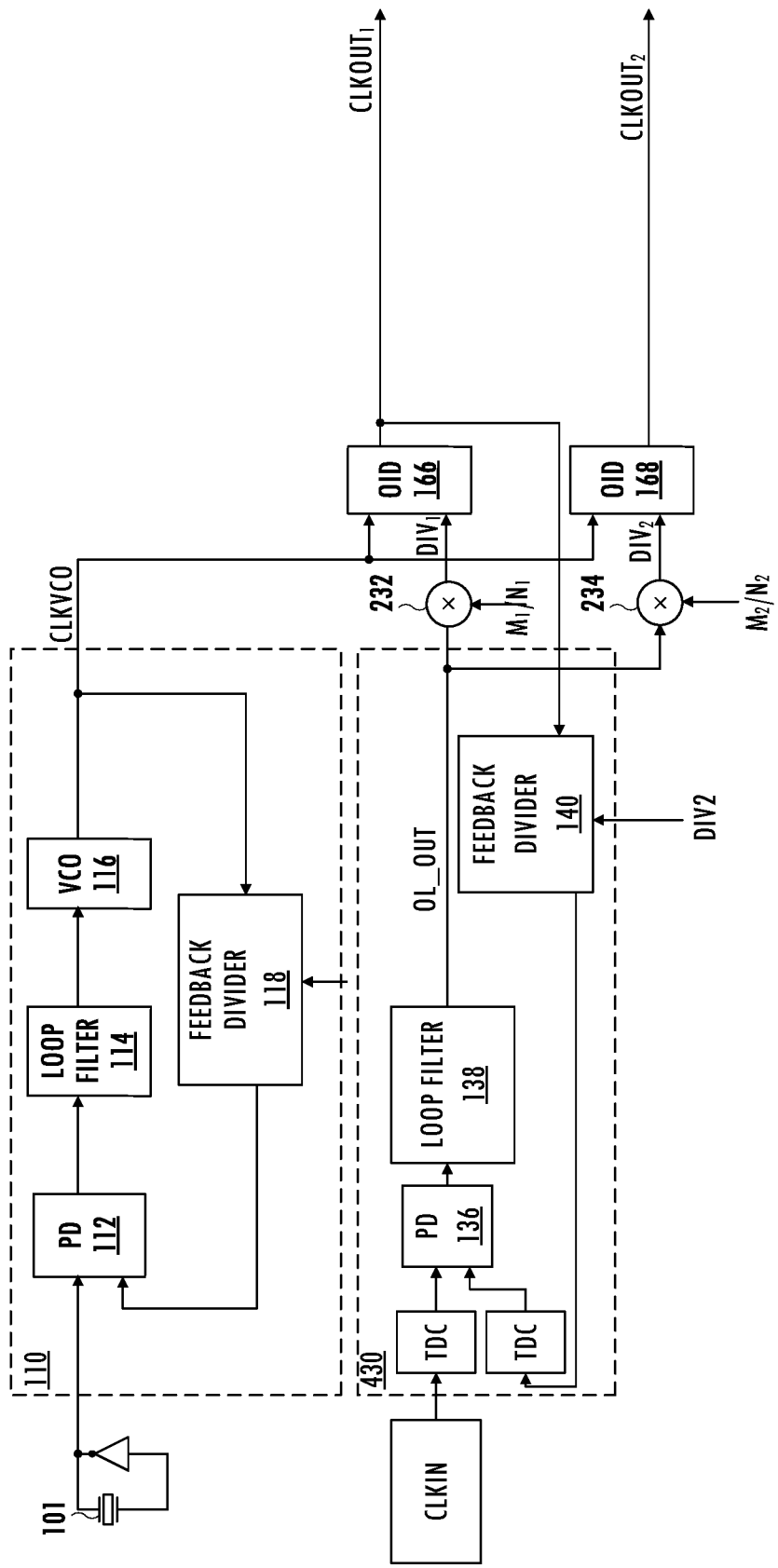
FIG. 4 illustrates a functional block diagram of a clock generator including multiple output dividers.
Figure 5:
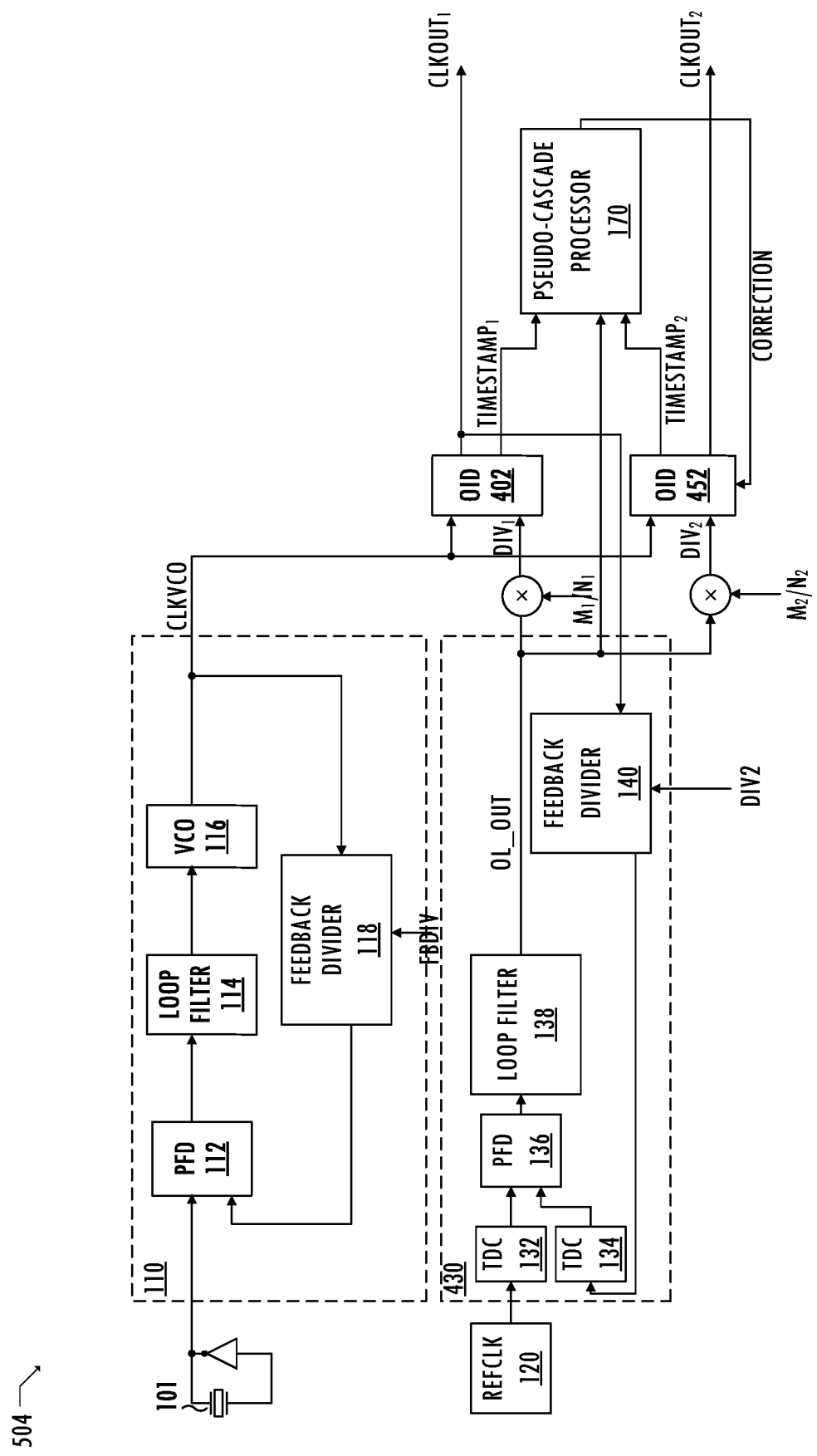
FIG. 5 illustrates a functional block diagram of a clock generator including pseudo-cascaded output dividers with error correction consistent with at least one embodiment of the invention.
Figure 6:
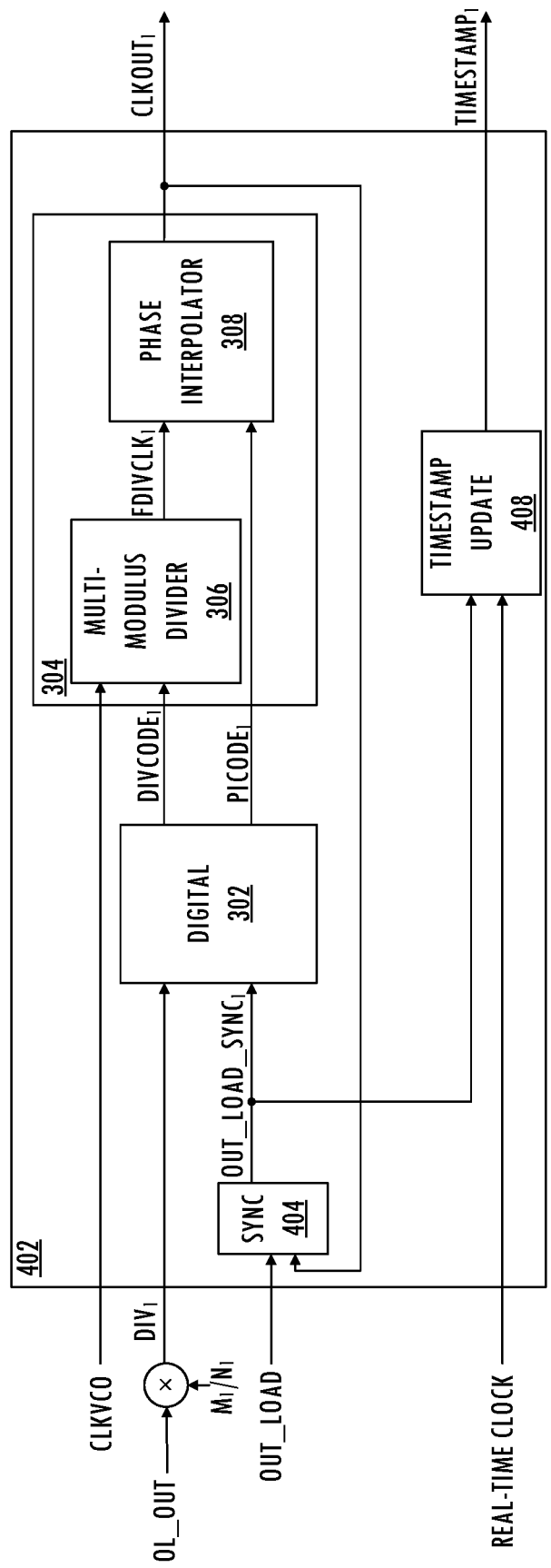
FIG. 6 illustrates a functional block diagram of an exemplary master output divider of the clock generator of FIG. 5 consistent with at least one embodiment of the invention.
Figure 7:
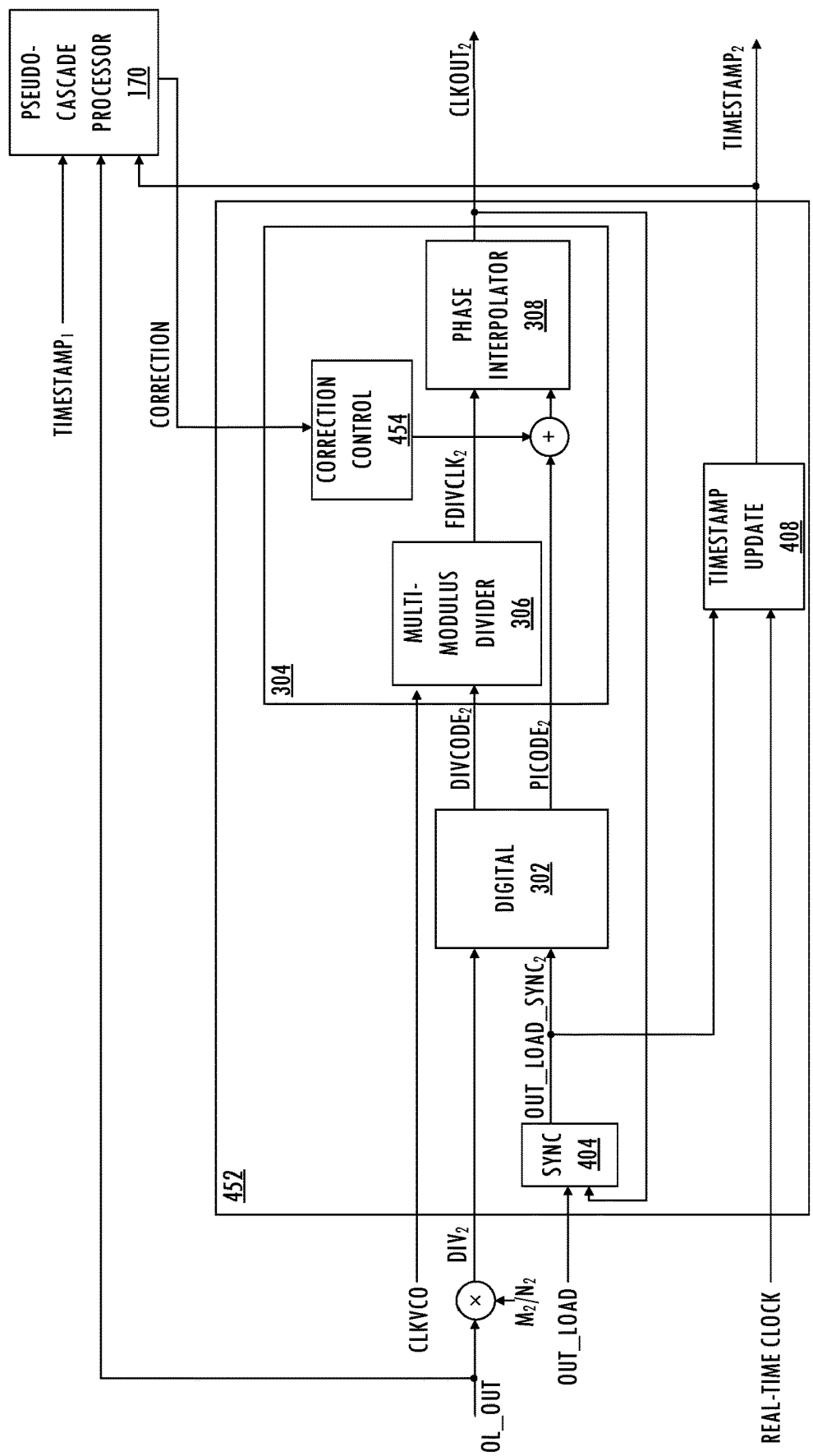
FIG. 7 illustrates a functional block diagram of an exemplary slave output divider of the clock generator of FIG. 5 consistent with at least one embodiment of the invention.

FIG. 4 illustrates a functional block diagram of a clock generator including multiple output dividers coupled in parallel. Although FIG. 4 illustrates output dividers that are output interpolative dividers, in other embodiments, the output dividers are integer frequency dividers or other frequency-dividing mechanisms. Multiple output dividers receive corresponding divider control signals that are corresponding divider codes modulated by filtered phase difference signal of a phase-locked loop. For example, output interpolative divider 166 and output interpolative divider 168 are driven by respective divider control signals DIV$_1$ and DIV$_2$ based on the same filtered phase difference signal OL_OUT of outer phase-locked loop 430. Output interpolative divider 166 is configured as a master output divider that generates output clock signal CLKOUT$_1$ that drives feedback divider 140 of phase-locked loop 430. Output interpolative divider 168 is configured as a slave output divider that generates output clock signals CLKOUT$_1$ and CLKOUT$_2$ driven by filtered phase difference signal OL_OUT that is generated based on the feedback signal provided by output interpolative divider 166. Multiplier 232 and multiplier 234 generate divider control signals DIV$_1$ and DIV$_2$, respectively, based on filtered phase difference signal OL_OUT and independent multiplicative codes M$_1$/N$_1$ and M$_2$/N$_2$, respectively.

Each output divider modulates a corresponding internal version of clock signal CLKVCO using a corresponding signal based on filtered phase difference signal OL_OUT and a corresponding multiplier code M$_n$/N (e.g., M$_1$/N$_1$ and M$_2$/N$_2$, respectively, although in some embodiments, N$_1$=N$_2$=N). Since output interpolative dividers operate by delaying by a fractional amount a frequency-divided clock edge generated by counting down an integer control code DIVE, as described above, output interpolative divider 166 accepts a next value of filtered phase difference signal OL_OUT at a different time than output interpolative divider 168 and edges of the output clock signals CLKOUT$_1$ and CLKOUT$_2$ are misaligned. Thus, the output interpolative dividers will be non-synchronous for a brief time in response to each change in the modulation value (e.g., filtered phase difference signal OL_OUT). In general, clock signal CLKVCO has a frequency that is much faster than the update rate of filtered phase difference signal OL_OUT (e.g., at least one order of magnitude). In an exemplary embodiment of a clock generator, clock signal CLKVCO has a frequency of approximately 13 GHz and filtered phase difference signal OL_OUT updates at a rate of approximately 1 MHz. However, other combinations of frequencies may be used. In general, a single phase misalignment between the output clock edges is less than the granularity of the output divider and is not detectable in the output clock signals. However, some divide values and modulation values cause this phase difference to accumulate in one direction (e.g., due to a large phase difference in response to a switch of the reference clock signal) or cause a random phase variation.

Referring to FIGS. 5, 6, 7, and 8, a technique that reduces phase misalignment of output clock signals generated by independently controlled output dividers couples the output dividers in a pseudo-cascaded configuration and includes error correction. Although FIGS. 5, 6, 7, and 8 illustrate output dividers that are output interpolative dividers, in other embodiments, the output dividers are integer frequency dividers or other frequency-dividing mechanisms. Pseudo-cascade processor 170 generates an error correction signal and provides the error correction signal to a slave output divider. In an embodiment of clock generator 504, each output divider in the pseudo-cascade configuration generates a digital time signal that correspond to a realization of an update of filtered phase difference signal OL_OUT from a current value to a next value. Pseudo-cascade processor 170 generates the error correction signal based on the digital time signals. A corresponding slave output divider uses the error correction signal to realign the output clock signal, e.g., in a slave output divider, prior to a next update of filtered phase difference signal OL_OUT. For example, master output interpolative divider 402 is configured as a master output divider and slave output interpolative divider 452 is configured as a slave output divider. Both master output interpolative divider 402 and slave output interpolative divider 452 generate corresponding time codes (e.g., $TIMESTAMP_1$ and $TIMESTAMP_2$) based on a counter signal (e.g., a real-time clock signal). The time codes indicate the time at which the corresponding output divider begins generating the output clock signal based on corresponding updated digital control signals $DIVCODE_n$ and $PICODE_n$ in response to an updated filtered phase difference signal OL_OUT. The slave output divider uses the error correction signal CORRECTION to align the phase of output clock signal $CLKOUT_2$ to output clock signal $CLKOUT_1$.

In at least one embodiment, loop filter 138 or other circuit toggles control signal OUT_LOAD synchronously with an update of filtered phase difference signal OL_OUT to indicate to the output dividers that loop filter 138 has updated filtered phase difference signal OL_OUT. Synchronization circuit 404 generates control signal OUT_LOAD_SYNC$_n$ that is synchronized to output clock signal CLKOUT$_n$. Control signal OUT_LOAD_SYNC$_n$ triggers digital circuit 302 (e.g., controls state elements within digital circuit 302) to update according to the new value of $DIV_n$, which is based on the updated filtered phase difference signal OL_OUT. That is, digital circuit 302 updates corresponding digital control signals $DIVCODE_n$ and $PICODE_n$ in response to control signal OUT_LOAD_SYNC$_n$.

In at least one embodiment, correction control 454 of slave output interpolative divider 452 receives a digital correction value from pseudo-cascade processor 170. In at least one embodiment, correction control 454 provides that digital correction value to an adder that combines the digital correction value with $PICODE_2$ to align output clock signal $CLKOUT_2$ to output clock signal $CLKOUT_1$. In another embodiment, correction control circuit 454 loads the digital correction value CORRECTION into a counter that counts down an integer portion of the digital correction value to zero as it provides control signals to a 1-bit adder circuit that increments or decrements digital control signal $PICODE_2$ accordingly, to align output clock signal $CLKOUT_2$ to output clock signal $CLKOUT_1$ over multiple cycles of output clock signal $CLKOUT_2$. Any arithmetic rollover triggers a corresponding increment or decrement to digital control signal $DIVCODE_2$. In addition, correction control 454 stores a fractional portion of the digital correction value CORRECTION in an accumulator with sufficient precision to keep the output aligned for a sufficient amount of time for the target application. In general, the precision of the accumulator determines the maximum possible error over time.

When the contents of the accumulator reach an integer value, digital circuit 302 increments the counter and clears or reduces the contents of the accumulator. In other embodiments, different techniques implement the correction, e.g., a full adder circuit implements the correction by adding digital correction value CORRECTION to control signal $PICODE_2$.

In at least one embodiment of an output interpolative divider, digital circuit 302 is a first-order delta-sigma modulator that generates the corresponding digital control signals $DIVCODE_n$ and $PICODE_n$. In at least one embodiment, digital circuit 302 has a pipelined architecture. An exemplary embodiment of digital circuit 302 includes a first-order delta-sigma modulator configured as a frequency modulator cascaded with a phase modulator including at least one higher-order delta-sigma modulator (e.g., third-order delta-sigma modulator) that updates the digital control signals $DIVCODE_n$ and $PICODE_n$. The pipelined structure of digital circuit 302 introduces a delay (i.e., one or more cycles of output clock signal CLKOUT$_n$) between digital circuit 302 being triggered to update by control signal OUT_LOAD_SYNC$_n$ and corresponding updates to digital control signals $DIVCODE_n$ and $PICODE_n$. In an exemplary embodiment of digital circuit 302 that delay is multiple cycles of (e.g., ten cycles of output clock signal CLKOUT$_n$) after control signal OUT_LOAD_SYNC$_n$ toggles digital circuit 302 to update.

Figure 8:
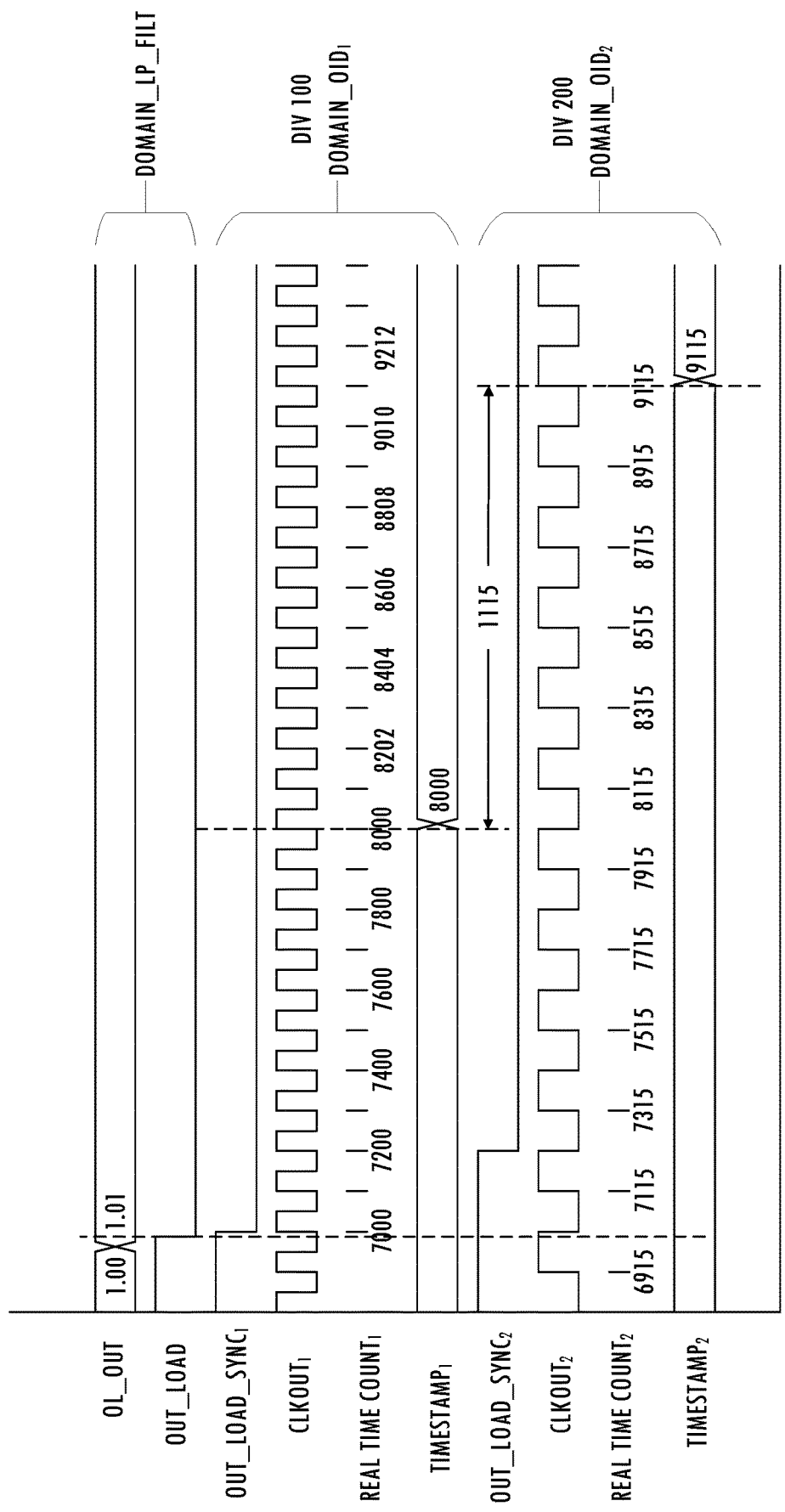
FIG. 8 illustrates a timing diagram including exemplary waveforms for the clock generator of FIG. 5 consistent with at least one embodiment of the invention.

The waveforms of FIG. 8 illustrate operation of clock generator 504 using exemplary exaggerated values. Assume that divider control signals $DIV_1$ and $DIV_2$ indicate a divide by 100 and a divide by 200, respectively. Control signal OUT_LOAD toggles to indicate an update to the value of filtered phase difference signal OL_OUT. Master output interpolative divider 402 and slave output interpolative divider 452 each detect the toggle of control signal OUT_LOAD on the corresponding rising edge of $CLKOUT_1$ and $CLKOUT_2$, respectively. Master output interpolative divider 402 and slave output interpolative divider 452 change corresponding control signals $DIVCODE_n$ and $PICODE_n$ after a delay of ten cycles of the corresponding output clock signal CLKOUT$_n$ through digital circuit 302. At real time count 8000, digital circuit 302 updates output control signals $DIVCODE_1$ and $PICODE_1$ and master output interpolative divider 402 begins to divide by 101. The value of time code $TIMESTAMP_1$ is 8000 and timestamp update circuit 408 provides the updated value of time code $TIMESTAMP_1$ to pseudo-cascade processor 170. At real time count 9115, digital circuit 302 updates output control signals $DIVCODE_2$ and $PICODE_2$ and slave output interpolative divider 452 begins to divide by 202. The value of time code $TIMESTAMP_2$ is 9115 and timestamp update circuit 408 provides the updated time code $TIMESTAMP_2$ to pseudo-cascade processor 170.

In at least one embodiment, pseudo-cascade processor 170 determines the correction value based on the difference in time between changes to control signals $DIVCODE_2$ and $PICODE_2$ of slave output interpolative divider 452 and changes to control signals $DIVCODE_1$ and $PICODE_1$ of master output interpolative divider 402 and a corresponding change to filtered phase difference signal OL_OUT:

$$CORRECTION = (TIMESTAMP_{SLAVE} - TIMESTAMP_{MASTER}) \times (\Delta OL\_OUT).$$

Where the difference in timestamps is 1115 real time clock cycles and the change to filtered phase difference signal OL_OUT is 0.01, as described above, pseudo-cascade processor 170 calculates the value of the correction signal CORRECTION as:

$$(TIMESTAMP_2 - TIMESTAMP_1) \times (\Delta OL\_OUT) = 1115 \times 0.01 = 11.15.$$

In an embodiment correction control circuit 454 loads the correction value into a counter and implements correction one least-significant bit at a time. In an embodiment, the least-significant bit correction is less than one time-unit which is 300 femto-seconds. Correction control circuit 454 loads the fractional portion, 0.15, into an accumulator. The integer portion, 11, is used by correction control circuit 454 to alter control signal $PICODE_2$ by one, distributed across 11 cycles. In addition, while the exemplary embodiments use one master output divider and one slave output divider, any integral number of slave output dividers may be coupled to a master output divider for synchronization of corresponding output clock signals to the output clock signal generated by the master output divider. For example, one master output divider may be pseudo-cascaded with four slave output dividers.

The pseudo-cascaded output divider embodiments of FIGS. 5-8 satisfy jitter specifications even when the divide ratios implemented by $M_1/N$ and $M_2/N$ are rational, fractionally related (i.e., not integrally related) ratios. The pseudo-cascade processing corrects relatively small phase errors that accumulate over time to reduce or eliminate phase error and related frequency error. Although the values used to illustrate operation of the phase error correction in FIG. 8 can occur under some circumstances (e.g., a switch of clock signal REFCLK 120), those values are exemplary only, and other actual divider values have a fractional relationship and cause smaller changes to filtered phase difference signal OL_OUT and timestamp differences. In normal operation, the phase locked loop tracks minute changes e.g., changes from clock signal REFCLK 120 and changes to crystal oscillator 101. To track those minute changes, filtered phase difference signal OL_OUT has fractional precision suitable for the target application (e.g., fractional precision of $10^{12}$ for tracking at $1 \times 10^6$ updates per second) and an output divider has precision suitable for the target application (e.g., 300 fs precision per divide and accumulation of the remainder at $10^{-21}$ for tracking at $1 \times 10^6$ updates per second).

Figure 9:
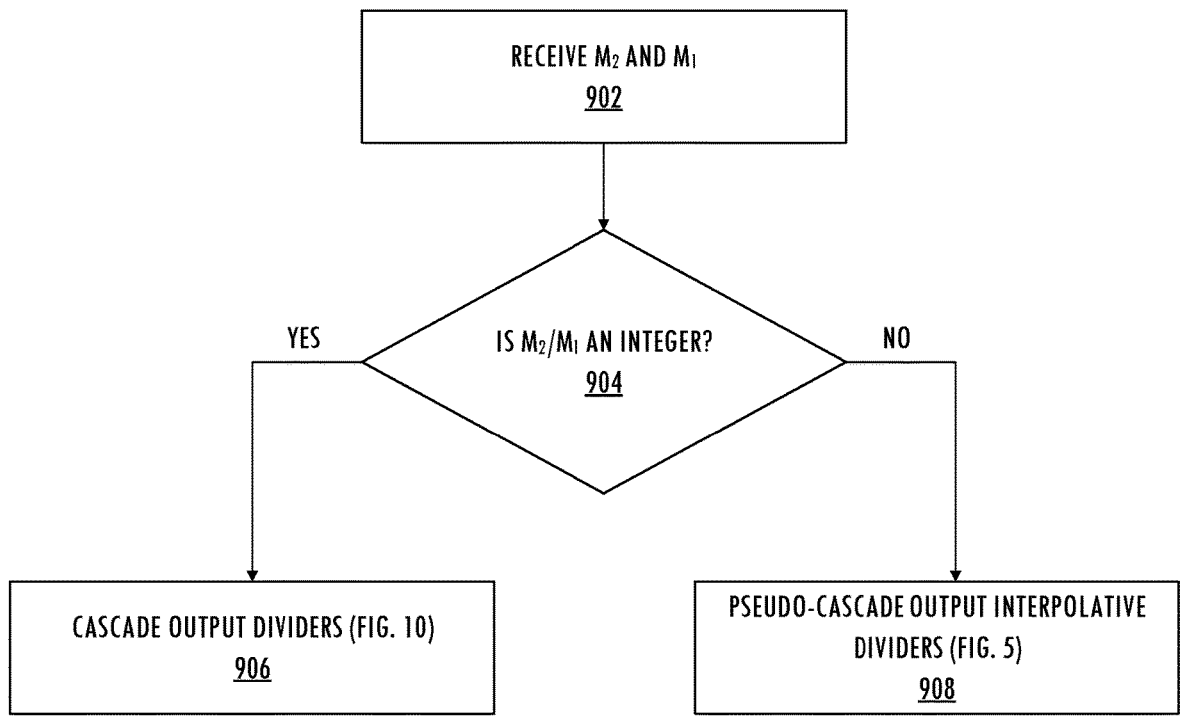
FIG. 9 illustrates an exemplary information and control flow for configuration of a clock product consistent with at least one embodiment of the invention.
Figure 10:
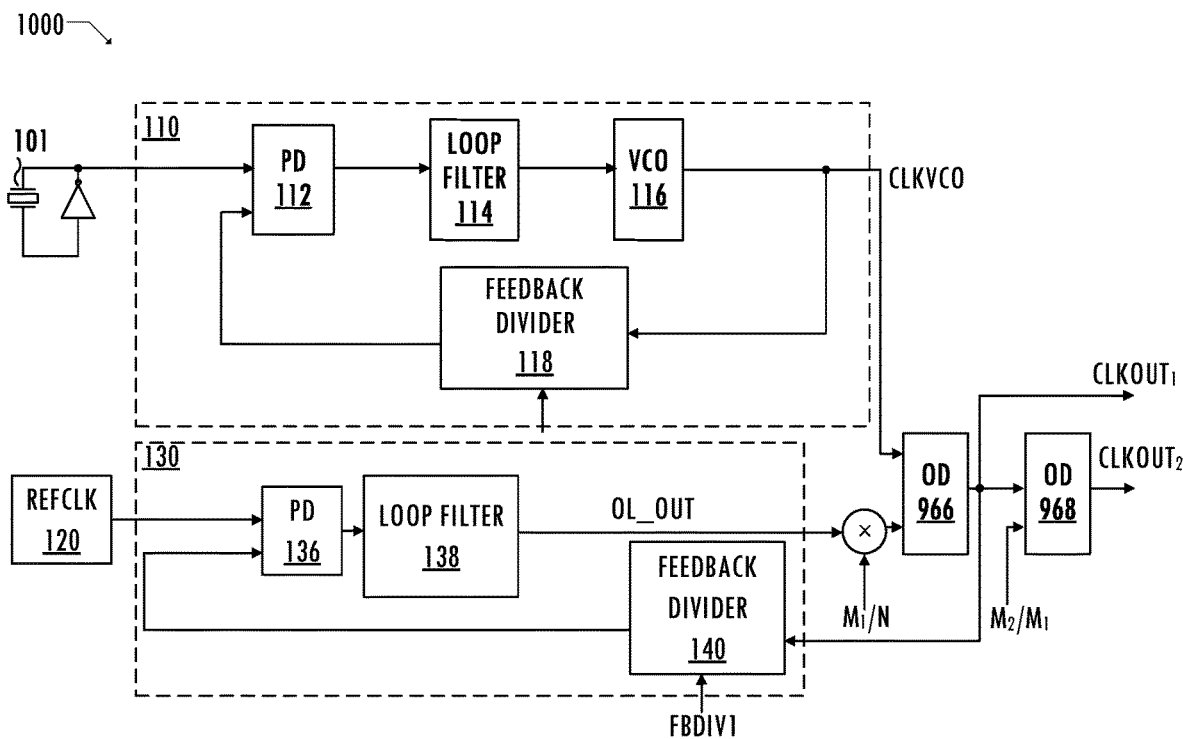
FIG. 10 illustrates a functional block diagram of a configuration of a clock product consistent with at least one embodiment of the invention.

Referring to FIGS. 9 and 10, in at least one embodiment, a clock product selectively configures a clock generator according to frequency divide values selected for a target application. When implementing multiple output interpolative dividers configured with integrally-related divider values, the output interpolative divider can be cascaded with an integer frequency divider (or an output interpolative divider configured to perform an integer frequency divide) introducing negligible or no phase error to the output clock signal and pseudo-cascade processing is not needed. Therefore, a selectively configurable clock product configures one or more phase-locked loops (e.g., an inner-loop phase-locked loop and an outer loop phase locked loop) to drive output dividers 966 and 968 (e.g., a combination of output interpolative dividers or integer dividers) and enables error compensation based on selected divider values determined to achieve target output clock signal frequencies.

For example, a target application uses divider values $M_2$ and $M_1$ that are received by a controller in a clock product (902). The controller determines whether $M_1$ is an integral multiple of $M_2$ (904). If $M_1$ is an integral multiple of $M_2$, then the controller cascades output dividers (which may be an output interpolative divider or integer divider) consistent with configuration 1000 of FIG. 10 (906). If the $M_1$ is not an integral multiple of $M_2$, then the controller configures a master output interpolative divider and a slave output interpolative divider in a pseudo-cascade configuration consistent with configuration of FIG. 5 (908).

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:
1. A clock generator comprising:
   a loop filter configured to generate a filtered phase difference signal based on a reference clock signal and a feedback clock signal;
   a first output divider configured to generate a first output clock signal responsive to an input clock signal and a first divider control signal based on the filtered phase difference signal and configured to generate a first time code based on a counter signal and a first update of the first output clock signal in response to an update of the filtered phase difference signal to a first value from a second value, the feedback clock signal being based on the first output clock signal;
   a second output divider configured to generate a second output clock signal responsive to the input clock signal, a second divider control signal, and a correction signal, the second divider control signal being based on the filtered phase difference signal, and configured to generate a second time code based on the counter signal and a second update of the second output clock signal in response to the update of the filtered phase difference signal; and
   an error correction circuit configured to generate the correction signal based on the first time code, the second time code, the first value, and the second value.
2. The clock generator, as recited in claim 1, wherein the error correction circuit generates the correction signal based on a first difference between the first value and the second value and a second difference between the first time code and the second time code.

3. The clock generator, as recited in claim 1, wherein the second output divider comprises:
a digital circuit configured to generate a divider code and a phase error code based on the second divider control signal and the digital circuit is further configured to adjust the phase error code according to the correction signal.

4. The clock generator, as recited in claim 1, wherein the error correction circuit comprises:
an accumulator configured to generate an error signal based on a first difference between the first value and the second value and a second difference between the first time code and the second time code; and
a comparator configured to update the correction signal in response to the error signal exceeding a threshold error value.

5. The clock generator, as recited in claim 1, further comprising:
a multiplier configured to generate the first divider control signal based on the filtered phase difference signal and a first digital control signal; and
a second multiplier configured to generate the second divider control signal based on the filtered phase difference signal and a second digital control signal.

6. The clock generator, as recited in claim 5, wherein the first digital control signal is independent from the second digital control signal.

7. The clock generator, as recited in claim 1, wherein the first output divider comprises a first time-to-digital converter responsive to a real-time clock signal.

8. The clock generator, as recited in claim 7, wherein the second output divider comprises a second time-to-digital converter responsive to the real-time clock signal.

9. The clock generator, as recited in claim 1, wherein the first time code and the second time code are generated based on a real-time clock signal.

10. The clock generator, as recited in claim 1, further comprising:
a controllable oscillator configured to generate the input clock signal,
wherein the input clock signal has a frequency at least one order of magnitude greater than an update frequency of the filtered phase difference signal.

11. A method for operating a clock generator comprising:
generating a filtered phase difference signal based on a reference clock signal and a feedback clock signal;
generating a first output clock signal based on a first divider control signal and an input clock signal, the first divider control signal being based on the filtered phase difference signal, the feedback clock signal being based on the first output clock signal;
generating a first time code based on a counter signal and a first update of the first output clock signal in response to an update of the filtered phase difference signal to a first value from a second value;
generating a second output clock signal based on a second divider control signal, the input clock signal, and an error correction signal, the second divider control signal being based on the filtered phase difference signal;
generating a second time code based on the counter signal and a second update of the second output clock signal in response to the update of the filtered phase difference signal; and generating the error correction signal based on the first value, the second value, the first time code, and the second time code.

12. The method, as recited in claim 11, wherein the error correction signal is based on a first difference between the first value and the second value and a second difference between the first time code and the second time code.

13. The method, as recited in claim 11, wherein generating the error correction signal comprises:
generating an error signal based on a first difference between the first value and the second value and a second difference between the first time code and the second time code; and
updating the error correction signal in response to the error signal exceeding a threshold error value.

14. The method, as recited in claim 11, wherein generating the second output clock signal comprises:
generating a divider code and a phase error code based on the second divider control signal; and
adjusting the phase error code according to the error correction signal.

15. The method, as recited in claim 11, further comprising:
generating the first divider control signal based on the filtered phase difference signal and a first digital control signal; and
generating the second divider control signal based on the filtered phase difference signal and a second digital control signal.

16. The method, as recited in claim 15,
wherein the first divider control signal is generated by multiplying the filtered phase difference signal by the first digital control signal; and
wherein the second divider control signal is generated by multiplying the filtered phase difference signal by the second digital control signal.

17. The method, as recited in claim 15, wherein the first digital control signal is independent from the second digital control signal.

18. The method, as recited in claim 15, wherein the first digital control signal is a nonintegral multiple of the second digital control signal and the method further comprises:
configuring a first output divider cascaded with a first phase-locked loop and to provide a feedback signal of the first phase-locked loop and configuring a second output divider cascaded with the first phase-locked loop in parallel with the first output divider and responsive to the error correction signal based on a difference in response times of the first output divider and the second output divider to a change in the filter phase difference signal of the first phase-locked loop.

19. The method, as recited in claim 18, further comprising:
selectively configuring the first digital control signal to be an integral multiple of the second digital control signal; and
configuring the first output divider to be cascaded with the first phase-locked loop and the second output divider cascaded with the first output divider.

20. The method, as recited in claim 11, further comprising:
generating the feedback clock signal based on the first output clock signal and a divider control signal.

* * * * *